United States Patent
Tsuchiya

(10) Patent No.: US 7,291,055 B2
(45) Date of Patent: Nov. 6, 2007

(54) WAFER POLISHING METHOD AND APPARATUS

(75) Inventor: Toshihiro Tsuchiya, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 130 days.

(21) Appl. No.: 10/523,976

(22) PCT Filed: Jul. 30, 2003

(86) PCT No.: PCT/JP03/09658

§ 371 (c)(1),
(2), (4) Date: Feb. 8, 2005

(87) PCT Pub. No.: WO2004/015752

PCT Pub. Date: Feb. 19, 2004

(65) Prior Publication Data

US 2006/0068681 A1    Mar. 30, 2006

(30) Foreign Application Priority Data

Aug. 9, 2002    (JP) .............................. 2002-232693

(51) Int. Cl.
*B24B 49/00*    (2006.01)
*B24B 51/00*    (2006.01)
*B24B 1/00*    (2006.01)

(52) U.S. Cl. .............................. 451/5; 451/41; 451/57; 451/59

(58) Field of Classification Search ...................... None
See application file for complete search history.

(56) References Cited

U.S. PATENT DOCUMENTS 4,373,991 A * 2/1983 Banks .......................... 451/28

(Continued)

FOREIGN PATENT DOCUMENTS

JP    11-188619 A1    7/1999
JP    2000-094316 A1    4/2000

(Continued)

OTHER PUBLICATIONS

English language abstract of JP 11 188619.*
International Search Report for PCT/JP03/09658 mailed on Nov. 18, 2003.

*Primary Examiner*—M. Rachuba
(74) *Attorney, Agent, or Firm*—Rader, Fishman & Grauer PLLC

(57) ABSTRACT

The present invention provides a wafer polishing method and a polishing apparatus which are capable of preventing peripheral sags of a wafer due to polishing and then manufacturing the wafer, especially an SOI wafer at a high flatness level. There is provided a wafer polishing method using a polishing apparatus which comprises a rotatable table having a polishing cloth adhered thereon and a polishing head equipped with a wafer holding plate opposing to the table and in which the back surface of the wafer is held by a holding surface of the wafer holding plate and the front surface of the wafer is pressed to and polished by the polishing pad, comprising a polishing step of polishing the front surface of the wafer to a predetermined total polishing stock removal without changing the polishing apparatus, wherein the polishing step is divided into plural sub-steps and a holding position of the wafer in a subsequent sub-step is different from a holding position of the wafer in a previous sub-step.

2 Claims, 8 Drawing Sheets

U.S. PATENT DOCUMENTS

| | | | | |
|---|---|---|---|---|
| 4,662,811 A | * | 5/1987 | Hayden | 414/433 |
| 5,398,459 A | * | 3/1995 | Okumura et al. | 451/41 |
| 5,738,568 A | * | 4/1998 | Jurjevic et al. | 451/41 |
| 5,762,539 A | * | 6/1998 | Nakashiba et al. | 451/41 |
| 6,372,593 B1 | * | 4/2002 | Hattori et al. | 438/311 |
| 6,465,316 B2 | * | 10/2002 | Hattori et al. | 438/311 |
| 6,533,646 B2 | * | 3/2003 | Volodarsky | 451/41 |
| 6,623,329 B1 | * | 9/2003 | Moore | 451/5 |
| 2001/0029155 A1 | * | 10/2001 | Bennett et al. | 451/56 |

FOREIGN PATENT DOCUMENTS

| | | |
|---|---|---|
| JP | 2002-503044 A1 | 1/2002 |
| WO | WO-99/41022 A1 | 8/1999 |

* cited by examiner (a)

(b)

(a)

(b)

WAFER POLISHING METHOD AND APPARATUS

TECHNICAL FIELD

The present invention relates to a wafer polishing method and a polishing apparatus which are capable of preventing peripheral sags of a wafer due to polishing and then manufacturing the wafer, especially an SOI (Silicon on Insulator) wafer at a high flatness level.

BACKGROUND ART

In recent years, in order to improve a yield in a device process, a requirement for a high flatness level of a semiconductor wafer such as a silicon wafer has been more and more enhanced. A manufacturing method for a mirror polished wafer with such a high flatness level has been generally constituted of: a single crystal growing process producing a single crystal ingot using a Czochralski (CZ) method, a Floating Zone (FZ) method or the like; and a wafer manufacturing (processing) process slicing the single crystal ingot into sliced wafers to process at least one main surface of each of the sliced wafers into a mirror polished surface. With thus manufactured mirror-polished wafer, devices have been fabricated.

A more detailed description of the wafer manufacturing (processing) process will be given below. The process includes: a slicing step of slicing a single crystal ingot to obtain a thin disk-like wafer; a chamfering step of chamfering a peripheral edge portion of the wafer obtained through the slicing step to prevent cracking or chipping of the wafer; a lapping step of flattening the wafer; an etching step of removing processing deformation remaining in the chamfered and lapped wafer; a polishing step of making a mirror surface of the wafer; and a cleaning step of cleaning the polished wafer to remove a polishing agent or dust particles deposited thereon. The above-described wafer processing process shows main steps thereof, and sometimes other steps such as a heat treatment step, surface grinding step and others may be added, or the same step may be divided into multiple sub-steps, or the step sequence may be changed.

Moreover, in recent years, an integration level in an integrated circuit has greatly increased, which has been accompanied by stricter required conditions imposed on a processing precision such as flatness or smoothness of a mirror-polished wafer surface. In addition, in order to achieve an integrated circuit higher in performance, reliability and product yield, not only a higher mechanical precision, but also better electric characteristics have been required. Especially, an SOI wafer, which is an ideal dielectric isolation substrate, has been used in applications to high frequency and high-speed devices mainly related to mobile communication equipment and medical equipment and further great increase in demand therefor is expected in the future.

An SOI wafer 50, as shown in FIG. 7, has a structure in which an SOI layer 52 (also referred to as a semiconductor layer or an active layer) for forming an element such as a single crystal silicon layer is formed on an insulating layer 54 (also referred to as a buried oxide (BOX) film layer or simply an oxide film layer) such as a silicon oxide film. The insulating layer 54 is formed on a support substrate 56 (also referred to as a substrate layer) and the SOI wafer 50 has a structure in which the insulating layer 54 and the SOI layer 52 are sequentially formed on the support substrate 56.

As conventional manufacturing methods for an SOI wafer 50 having the SOI structure in which the SOI layer 52 and the support substrate 56 are made of, for example, silicon and the insulating layer 54 is made of, for example, a silicon oxide film, there are exemplified a SIMOX (Separation by implanted oxygen) method in which oxygen ions are implanted into a silicon single crystal at a high concentration and thereafter the single crystal is subjected to heat treatment at a high temperature to form an oxide film thereon; and a bonding method (adhering method) in which two mirror-polished wafers are bonded with each other without the use of an adhesive, followed by processing one of the bonded wafers into a thin film.

Since the SIMOX method can controllably determine a film thickness of an active layer portion (SOI layer) 52 to serve as a device active region by an acceleration voltage in oxygen ion implantation, there is an advantage to obtain a thin active layer high in film thickness uniformity easily whereas there have remained many problems of reliability of a buried oxide (BOX) film (insulating layer) 54, crystallinity in an active layer, and others.

On the other hand, a wafer bonding method is carried out in such a way that an oxide film (insulating layer) 54 is formed on at least one of two single crystal silicon mirror-polished wafers, then both wafers are adhered to each other without using an adhesive, then a composite wafer is subjected to heat treatment (usually at a temperature in the range of 1100° C. to 1200° C.) to strengthen bonding therebetween and thereafter one of the wafers is thinned into a thin film by grinding or wet etching, followed by mirror-polishing the surface of the thin film so as to form an SOI layer 52; which leads to advantages that reliability of the buried oxide film (insulating layer) 54 is high and crystallinity of the SOI layer is also good. However, the thus adhered SOI wafer 50 is subjected to mechanical processing such as grinding or polishing into a thin film, and hence the obtained SOI layer 52 have limitations in its film thickness and uniformity thereof.

As a manufacturing method for an SOI wafer, it has very recently started to pay attention to a method for manufacturing an SOI wafer by bonding of an ion implanted wafer and separating of the wafer. This method is also referred to as an ion implantation separation method, which is such a technique that as shown in FIG. 8. In this method, two silicon wafers 52a and 56a are provided to be ready for use (FIG. 8(a), step 100); an oxide film (insulating layer) 54a is formed on at least one wafer 52a (referred to as a bond wafer) (FIG. 8(b), step 102); hydrogen ions or rare gas ions are implanted onto the upper surface of the one wafer 52a (FIG. 8(c), step 104); a micro-bubble layer (enclosed layer) 58 is formed in the interior of the wafer 52a, the surface onto which the ions are implanted is contacted and adhered with the other silicon wafer 56a (referred to a base wafer) through the oxide film 54a (FIG. 8(d), step 106); thereafter heat treatment is applied to the adhered wafers to separate the one wafer 52a as a thin film with the micro-bubble layer 58 as a cleavage plane (FIG. 8(e), step 108); and heat treatment is further applied to the rest of the adhered wafers to strengthen the bond to thereby obtain an SOI wafer 50 (FIG. 8(f), step 110) (see JP-A No. 5-21128). The cleavage plane is a good mirror-polished surface and the SOI wafer 50 having high uniformity of film thickness of the SOI layer 52 can be obtained with relative ease. Furthermore, in some cases the thus obtained SOI layer 52 is subjected to CMP polishing in order to remove strain therein and make the layer to be a thinner film (FIG. 8(g), step 112).

While there have been developed various types of polishing apparatuses for manufacturing such a mirror-polished wafer or an SOI wafer, many of them are directed to improvements on holding means for polishing (polishing heads and besides wafer holding plates), for example, means for holding a wafer on a soft holding surface such as a backing pad or the like, means for vacuum chuck and a template (a retainer).

For example, JP-A No. 7-171757 discloses a polishing head in which a wafer is vacuum chucked on a wafer vacuum chucking plate made of a flexible thin plate provided on an opening at the lower portion of the wafer holding member, the wafer holding member is vertically hung and held in a housing by an expandable cylindrical member and a high flexible holding member, and a compressed air at a given pressure is introduced into the hermetically sealed housing to eliminate an influence of the weight of the wafer holding member itself to thereby polish a wafer only at a uniform air pressure.

Also, JP-A No. 2000-198069 discloses a technique related to a polishing head (a wafer holding method) where in a polishing work holding plate equipped with a work holding plate body having multiple through-holes vacuum chucking a work, a holding surface of the holding plate body is covered with a film obtained by thermally curing a thermosetting resin coated on the holding surface and the surface of the film is polished.

Further, JP-A No. 2002-113653 discloses a polishing head where in a substrate holding device that holds a semiconductor wafer as an object for polishing and pressing the wafer to a polishing surface on a polishing table, there are provided a top ring body holding the semiconductor wafer, a retainer ring fixed to the top ring body or formed into a single piece together therewith holding the outer peripheral edge of the semiconductor wafer and a fluid room provided in the top ring body as well as covered with an elastic membrane, wherein by supplying a pressure fluid into the fluid room, the semiconductor wafer is pressed to the polishing surface through the elastic membrane and by imposing a pushing force to the top ring body, the retainer ring is pressed to the polishing surface.

In addition to the above disclosed techniques, JP-A No. 08-257893 discloses a polishing head in which the outer peripheral portion of a wafer is held in a state capable of elastically deforming in the thickness direction of a wafer; and JP-A No. 11-42550 discloses a technique in which a first space portion pressing a carrier and a second space portion pressing a retainer ring are provided, wherein a pressure air is supplied into the first and second space portions to elastically deform the central portion and the outer peripheral portion of an elastic sheet to thereby press the carrier and the retainer ring to a polishing table.

Thus there have been developed various techniques related to a polishing head and wafer holding for a polishing apparatus used in manufacturing a mirror-polished wafer, an SOI wafer and the like. As shown in FIG. 9, a polishing apparatus 10 of this kind comprises, as a fundamental structure: a rotatable table 14 having a polishing cloth 12 adhered thereon; a polishing head 18 equipped with a wafer holding plate 16 provided opposing to the table 14; and a retainer ring 20 holding a wafer (W) by the outer peripheral edge thereof, wherein when polishing, a polishing agent 24 is supplied onto the polishing cloth 12 from a polishing supply tube 22, the back surface of the wafer (W) is held on a holding surface 16a of the wafer holding plate 16 through a backing pad 26 or the like (the wafer may be held with a synthetic resin member, a ceramic member, an elastic member or the like), and the polishing head 18 is pressed to thereby press the surface of the wafer (W) to the polishing cloth 12 for polishing. Incidentally, in FIG. 9, numerical reference 28 designates a rotary shaft of the table 14, and 30 a driving shaft for the polishing head 18. A polishing apparatus having a structure without the retainer ring 20 has been conventionally employed.

However, attempts have been made to process a wafer to a high flatness level by contriving a mechanism of a polishing head or the like, but there has been a limitation on mechanical improvements. That is, there has been a technical portion in which improvements are limited because of the remaining influence of flatness (a fluctuation in thickness) of a holding surface of a wafer holding plate, distortion caused by assembly or the like.

For example, in the above-described manufacture of the SOI wafer, a wafer having the SOI layer excellent in flatness can be manufactured by means of an ion implantation separation method. Polishing may be conducted in order to make the SOI layer thin. Due to the polishing, the SOI layer may be degraded in flatness (sags of a surface) against the purpose thereof. Flatness required for the SOI wafer is especially 10 nm or less in in-plane dispersion for a 300 mm diameter wafer, which is much severer as compared with a level of about 1 μm (1000 nm) or less in in-plane dispersion required for a mirror-polished wafer subjected to the ordinary process for manufacturing (processing) a wafer. Therefore, even slight degradation in flatness gives rise to a problem. The degradation in flatness is caused by an influence of a fluctuation in a holding surface of a wafer holding plate of a polishing head or distortion due to assembly. It has been demanded to improve configuration degradation in a portion not to be mechanically corrected.

DISCLOSURE OF THE INVENTION

The present invention has been made in light of the problems of the conventional technique and it is an object of the present invention to provide a wafer polishing method and a polishing apparatus which are capable of preventing peripheral sags of a wafer due to polishing and then manufacturing the wafer, especially an SOI wafer at a high flatness level.

In order solve the above-mentioned problems, according to the present invention there is provided a wafer polishing method using a polishing apparatus which comprises a rotatable table having a polishing cloth adhered thereon and a polishing head equipped with a wafer holding plate opposing to the table and in which the back surface of the wafer is held by a holding surface of the wafer holding plate and the front surface of the wafer is pressed to and polished by the polishing pad, comprising a polishing step of polishing the front surface of the wafer to a predetermined total polishing stock removal without changing the polishing apparatus, wherein the polishing step is divided into plural sub-steps and a holding position of the wafer in a later sub-step is different from a holding position of the wafer in a previous sub-step.

That is, in the polishing method of the present invention, using the same polishing apparatus, in other words, one and the same polishing head and one and the same wafer holding plate, only a wafer holding position is changed and the polished wafer is again polished to thereby perform a kind of multi-step polishing. By thus changing only a wafer holding position of the wafer held by a specific wafer holding plate at a time during polishing, an influence of a portion that could not be mechanically corrected under an influence of a fluctuation of a holding surface of a wafer holding plate of a polishing head or an influence of distortion from assembly, especially sags or rises at the outer peripheral portion can be cancelled; a high flatness wafer can be manufactured.

The change of the wafer holding position may be performed by rotating a holding position of the wafer about the center thereof as the center of rotation by a predetermined rotational angle. For the purpose, for example, the wafer is removed from the wafer holding plate, and then the wafer and/or the wafer holding plate may be rotated. In such a way, it is realized that the wafer holding plate may not hold the same position of the outer peripheral portion of the wafer when performing second polishing. The change in wafer holding position may be set at any of angles any number of times, while it is preferable that a feature of the wafer configuration obtained on each polishing head is investigated in advance and the change in wafer holding position is set properly according to the wafer configuration.

For example, in a case under an influence of a fluctuation of a holding surface of a wafer holding plate of a polishing head or an influence of distortion from assembly, a wafer configuration has had a tendency to take the shape of a saddle. That is, as shown in FIG. 10, a first sag (D) is generated at a first part of the outer peripheral portion of a wafer (W) and a second sag (D) is similarly generated at a second part of the outer peripheral portion thereof opposite to the first part (a part rotated from the first part by 180 degrees), while a first rise (H) is generated at a part rotated by about 90 degrees from the first or second sag (D) and a second rise (H) is similarly generated at a part opposite to the first rise. Herein, the term "rise (H)" means a portion at the outer peripheral portion of a wafer where thickness is slightly more than the surface portion of the wafer, for example, as shown in FIGS. 10 (a) (b), parts in light color of the outer peripheral portion of the wafer, while the term "sag (D)" means a portion at the outer peripheral portion of a wafer where a thickness is slightly less than the surface portion of the wafer, for example, parts in dark color of the outer peripheral portion of the wafer as shown in FIGS. 10 (a) (b).

In such a case, if the number of the divided sub-steps of the polishing step is determined in advance, an angle is obtained by dividing a waviness cycle along the outer peripheral portion by the number (n) of the sub-steps of the polishing step and the wafer holding position is changed with the obtained angle. That is, in a case shown in FIG. 10, the waviness cycle along the outer peripheral portion is 180 degrees and in this case, if the number (n) of the divided sub-steps of the polishing step is set to, for example, n=3, the wafer holding position is shifted by angular spacing of 180 degrees/3=60 degrees when polishing.

In another resort, the change of the wafer holding position may be set to ½ of the waviness cycle along the outer peripheral portion. In this case, the number (n) of the divided sub-steps of the polishing step is preferably set to an even number of 2 or more.

In a case of a polishing apparatus having a polishing head with which a wafer is easily manufactured with the above-mentioned waviness cycle of 180 degrees, at a time during polishing, after shifting the wafer holding position by 90 degrees (180 degrees/2=90 degrees), the wafer may be subjected to second polishing. That is, in a case where such a characteristic cycle configuration appears along the wafer outer peripheral portion, polishing is conducted after shifting a wafer by an angle of the order of ½ of a waviness cycle of the wafer outer peripheral portion. By conducting polishing according to the plural sub-steps under such conditions, sags or the like of the wafer outer peripheral portion can be effectively prevented.

A polishing stock removal in each sub-step is preferably set to a value obtained by dividing the total polishing stock removal by the number (n) of the divided sub-steps of the polishing step. By making the polishing stock removal in each sub-step almost uniform, an effect of canceling sags and rises can be easily obtained.

Incidentally, in methods polishing a single surface of a wafer, there is a system in which a wafer itself is rotated during polishing according to polishing conditions. For example, in a system called a wax-free method in which a wafer is held by a backing pad through water, a method in which air is blown from a wafer holding portion during polishing and the like, a wafer itself may rotate according to polishing conditions including a rotational speed of a polishing head, a rotational speed of a table (a polishing cloth) or the like. When the wafer itself is rotated during polishing, a fluctuation of a holding surface of a wafer holding plate of a polishing head or the like is also canceled, whereas when rotating the wafer, the back surface of the wafer may be damaged by its rotation, the wafer may rotate irregularly due to an influence of a fluctuation of a holding surface of a wafer holding plate of a polishing head or an influence of distortion from assembly, or the wafer may stop its rotation due to an influence of distortion from assembly, that is, uneven polishing may be conducted, which degrades flatness of the wafer to thereby negate stable polishing in some case.

Therefore, in the method of the present invention, it is preferable that a wafer itself does not rotate during polishing. That is, the method of the present invention is especially useful in a system to polish a wafer front surface while holding a wafer back surface. In addition, the method of the present invention can ensure a predetermined effect even in any type of a wafer holding plate and a holding method. As for an apparatus used in the method of the present invention, a single wafer type (a polishing system in which a single wafer is held by one polishing head during polishing) is easily adopted, while a similar effect can also be secured in a batch type (a polishing system in which plural wafers are held on one polishing head).

In a manufacturing step (polishing step) for a mirror-polished wafer, it is general to hold a wafer on different polishing heads in first polishing, second polishing and final polishing, respectively, and to thereby polish the wafer in plural steps. The method of the present invention can be implemented on a polishing head used in any step of such plural polishing steps. In a case where such multi-step polishing is applied, however, the method of the present invention is preferably implemented in the later polishing step. This is because waviness remaining or generated in such a step is not improved in a subsequent step, directly resulting in reduction in a yield of a device process. In the first polishing step, the second polishing step follows; therefore, even if an influence of a polishing head of a first polishing apparatus is exerted, by using a different polishing head in the second polishing step, degradation only in a configuration of a specific portion is prevented, which leads to a great possibility of uniformity. In this case, however, an influence such as waviness of a polishing head of a second polishing apparatus remains. It is preferable that such an influence can be removed in the next step, while there arises a case where the influence cannot be perfectly removed according to a polishing stock removal. Therefore, in view of the polishing stock removal or the like in each step, it is properly determined in which step the method of the present invention should be applied.

The method of the present invention is especially useful in application to manufacture of an SOI wafer to which attention has paid in recent years. Making an SOI layer into a thin film has become an important issue in manufacture of an SOI wafer. Making an SOI layer into a thin film has been realized by heat treatment, polishing or the like, while in a case of polishing, it is important to enable a wafer with a surface (SOI layer) already processed to high flatness to be further reduced without affecting a configuration thereof adversely, which is a step where an influence of a shape of a wafer holding portion of a polishing head is easily exerted. By using the polishing method of the present invention in a polishing step adopted in manufacture of such an SOI wafer, it is possible to manufacture a thin film SOI wafer processed to high flatness, which is especially preferable.

A polishing apparatus of the present invention usable in the wafer polishing method according to the present invention, comprises a rotatable table having a polishing cloth adhered thereon and a polishing head equipped with a wafer holding plate opposing to the table, wherein the back surface of the wafer is held by a holding surface of the wafer holding plate and the front surface of the wafer is pressed to and polished by the polishing pad, and wherein a mark serving as a guide is formed at a predetermined position of the polishing head.

The mark of the polishing head has only to be formed so as to enable a relative positional relationship between a predetermined position on a wafer (for example, a notch portion) and a predetermined position on the wafer holding plate of a polishing head to be recognized, wherein any position, such as a side surface of the polishing head, a part of the wafer holding plate, a part of a retainer ring if any, or the like may be selected to provide the mark. A form of the mark may be arbitrary. By using a polishing head with such a mark, a wafer holding position can be changed exactly.

The present polishing apparatus preferably further comprises a wafer changing unit equipped with a rotatable changing stage, wherein when changing the plural sub-steps in the wafer polishing method according to the present invention, the wafer held on a holding surface of the wafer holding plate is delivered to the changing stage, a relative position of the changing stage holding the wafer to the wafer holding plate is rotated by a predetermined angle, and thereafter the wafer is restored to the wafer holding plate from the changing stage and is again held thereon for another polishing.

Incidentally, as embodiments for rotation of a relative position of the changing stage to the wafer holding plate, there may be employed not only a mechanism to rotate the changing stage by a predetermined angle, but a mechanism to rotate the polishing head by a predetermined angle, and it is also possible to rotate both of them so as to assume a predetermined angle of rotation.

The wafer changing unit preferably includes a rotatable changing stage which holds a wafer detachably and is rotated by a changing stage rotating mechanism, and a polishing head moving mechanism which makes the polishing head move between the table and the wafer changing unit.

BEST MODE FOR CARRYING OUT THE INVENTION

Description will be given of embodiments of the present invention below based on the accompanying drawings and it is needless to say that the examples shown in the figures are shown by way of illustration only and various modifications or variations can be implemented as far as not departing from the technical concept of the present invention.

Figure 1:
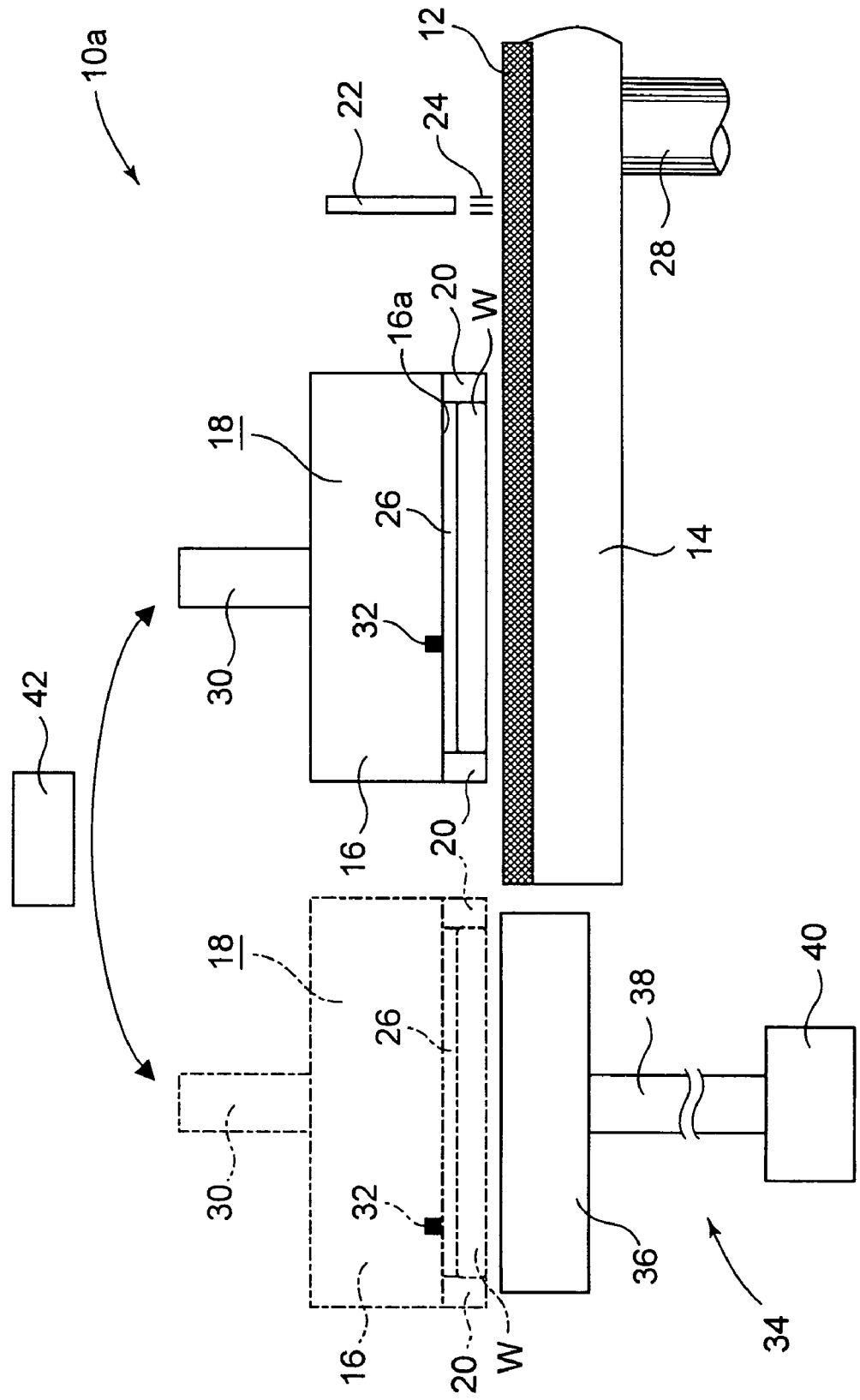
FIG. 1 is a schematic, descriptive side view showing one embodiment of a polishing apparatus of the present invention.

FIG. 1 is a schematic, descriptive side view showing one embodiment of a polishing apparatus of the present invention used in implementing a wafer polishing method of the present invention. In FIG. 1, reference numeral 10*a* designates a polishing apparatus of the present invention, a fundamental structure of which is similar to that of the conventional polishing apparatus 10 shown in FIG. 9. The same or similar members in FIG. 1 as or to those in FIG. 9 are indicated with the same reference numerals.

Figure 9:
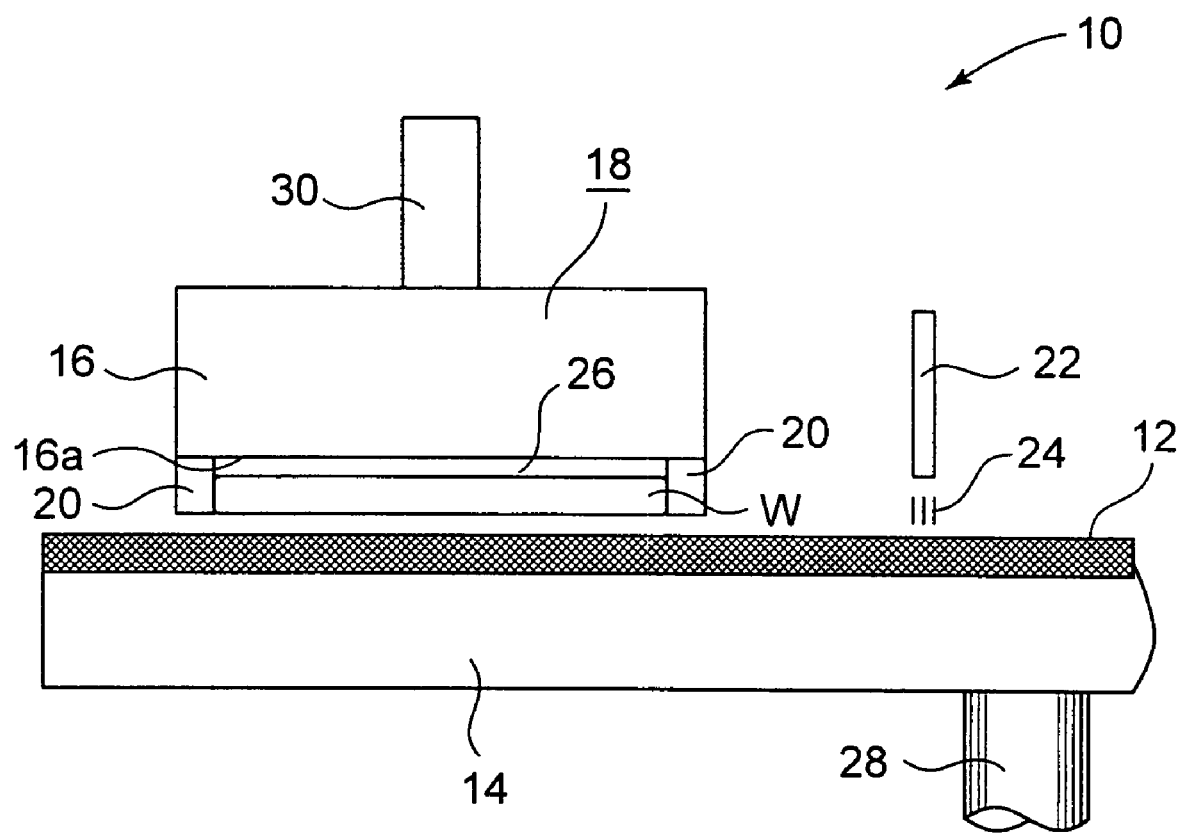
FIG. 9 is a schematic, descriptive side view showing an example of a conventional polishing apparatus.
Figure 10:
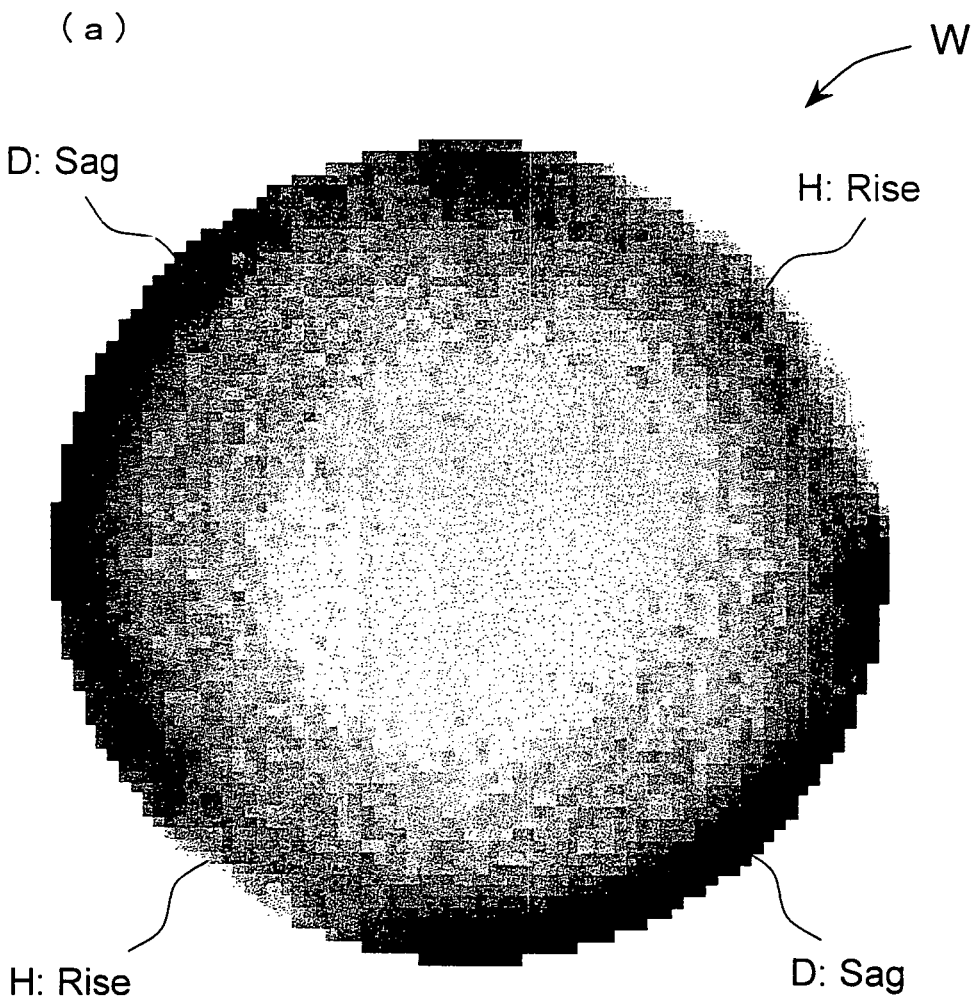
FIGS. 10(*a*) and 10(*b*) are descriptive diagrams of one example of sags and rises generated in the outer peripheral portion of a polished wafer, wherein FIG. 10(*a*) shows surface unevenness with tone and FIG. 10(*b*) is a schematic diagram of FIG. 10(*a*).
Figure 10:
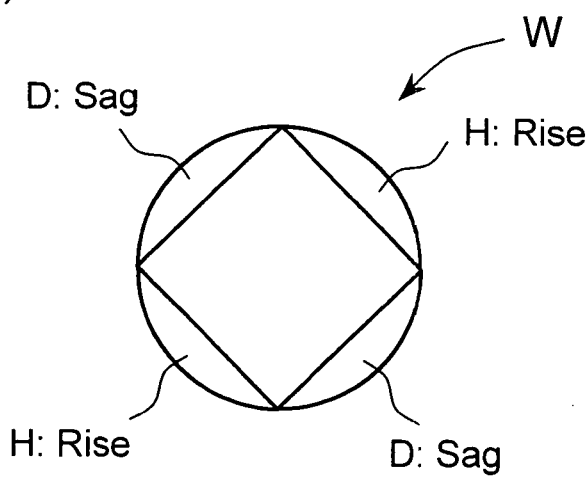

The polishing apparatus 10*a* has: a rotatable table 14 to the top surface of which a polishing cloth 12 is adhered similarly to that in the polishing apparatus 10 of FIG. 9; a polishing head 18 equipped with a wafer holding plate 16 opposing to the table 14; and a retainer ring 20 holding a wafer (W) by the outer peripheral edge thereof Through holes (not shown) for vacuum chuck are formed in the wafer holding plate 16. When the wafer (W) is polished, a polishing agent 24 is supplied onto the polishing cloth 12 from a polishing agent supply tube 22, the back surface of the wafer (W) is held on a holding surface 16*a* of the wafer holding plate 16 through a backing pad 26 and the polishing head 18 is pressurized such that the front surface of the wafer (W) is pressed to the polishing cloth 12 to thereby polish the front surface thereof. In FIG. 1, reference numeral 28 designates a rotary shaft of the table 14 and reference numeral 30 designates a driving shaft of the polishing head 18. Incidentally, the wafer (W) may also be held by a synthetic resin member, a ceramic member, an elastic member, or the like instead of the backing pad. In the polishing apparatus of the present invention, a structure without the retainer ring 20 may be adopted as in the case of the conventional apparatus 10.

In the wafer polishing method of the present invention, when implementing a polishing step of polishing a wafer up to a predetermined polishing stock removal without changing a polishing apparatus, that is using one and the same polishing apparatus, a wafer holding position is changed at least once before the polishing stock removal value reaches the predetermined one, in other words the polishing step is divided into plural sub-steps and a wafer holding position in a subsequent sub-step is changed to a position different from a wafer holding position in a previous sub-step.

Therefore, it is preferable that a positional relationship between the polishing head 18, especially the wafer holding plate 16 and the wafer (W) can be recognized after the polishing. For example, as shown in FIG. 1, a mark 32 serving as a guide is formed on a part of the wafer holding plate 16 of the polishing head 18, and a specific position of the wafer, for example, a notch (N) (FIG. 6) is set to the mark mechanically or manually, then the wafer being held by the wafer holding plate. Wafer holding positions in the second sub-step and the following sub-steps are adjusted with the position of the mark 32 as a reference.

In FIG. 1, reference numeral 34 designates a wafer changing unit, which is provided adjacent to the polishing apparatus 10a. The wafer changing unit 34 has a changing stage 36 holding the wafer W on the top surface thereof detachably. The changing stage 36 is rotated by a changing stage rotating mechanism 40 through a shaft 38. On the other hand, reference numeral 42 designates a polishing head moving mechanism, which moves the polishing head 18 between the table 14 and the wafer changing unit 34.

With the wafer changing unit 34, the above-described change of the wafer holding position can be automatically performed. For example, after polishing in the first sub-step ends, the polishing head 18 holding the wafer (W) is moved to the wafer changing unit 34; and the wafer (W) is then delivered onto the changing stage 36 of the wafer changing unit 34 while the positional relationship between the polishing head 18 and the wafer holding plate 16 is unchanged; after the wafer changing stage 36 is rotated by a predetermined angle, the wafer (W) is again held on the polishing head 18; and the polishing head 18 is moved onto the table 14, thereby polishing in the next sub-step being carried out. In order to exactly perform the above-described change of the wafer holding position, it is required that the changing stage 36 functions so as to enable the wafer (W) to be vacuum chucked without shifting the position of the wafer (W), and the changing stage rotating mechanism 40 functions so as to enable the changing stage 36 to be exactly rotated at any angle Incidentally, a structure of the wafer changing unit 34 is not specifically limited as far as it can exactly control a relative holding position between the wafer holding plate 16 and the wafer (W), and various kinds of structures other than the embodiment shown in the figure can be adopted. As a way of rotation in a relative position between the changing stage 36 and the wafer holding plate 16, in addition to the mechanism in which the changing stage 36 is rotated by a predetermined rotation angle as described above, a mechanism may also be adopted in which the polishing head 18 is rotated by a predetermined rotation angle or both of them are rotated so as to attain a predetermined rotation angle.

EXAMPLES

While further concrete description will be given of the present invention, showing examples below, it is needless to say that the examples are presented by way of illustration and should not be construed by way of limitation.

Example 1

Plural wafers manufactured by means of an ion implantation separation method as SOI wafers serving as polishing objects were provided to be ready for use. The wafers as starting raw materials each had parameters, such as a diameter of an SOI wafer of 300 mm, a thickness of a support substrate of about 775 nm, a thickness of an oxide film layer is about 145 nm and a thickness of an SOI layer of about 340 nm, and description will be given of a case where polishing was carried out with a total polishing stock removal of about 90 nm as an example.

There was employed as a polishing apparatus F-REX300 manufactured by Ebara Corporation to polish the SOI wafers. A suede type polishing cloth, Ciegal 7355fm (a lattice groove of 20 mm square) manufactured by Toray Coatex Co., Ltd. was used as a polishing cloth, and G33900RS manufactured by Fujimi Incorporated was employed as a polishing agent. A polishing pressure was 240 g/cm$^2$.

Since a target polishing stock removal (a total polishing stock removal) in this example was 90 nm, a polishing stock removal was set to about 45 nm in the divided first sub-step, and then polishing in the first sub-step was carried out. Next, the wafer was held again and thereafter in the second sub-step was carried out. Incidentally, the wafer holding position in the second sub-step was rotated by 90 degrees from the wafer holding position in the first sub-step with the center of the wafer as a center of rotation.

In order to determine the rotation angle, it is required that a feature of the polishing head is investigated and recognized in advance. In this example, as in the case of an SOI wafer of Comparative Example 1 described below, cyclic waviness in the outer peripheral portion of a wafer (a cycle of about 180 degrees) was observed; a rotation angle is determined as 180 degrees/2=90 degrees and a wafer holding position in the second sub-step was rotated by 90 degrees from the wafer holding position in the first sub-step with the center of a wafer as a center of rotation to then continue polishing. The number (n) of the divided sub-steps was 2.

Polishing in the second sub-step was carried out with a polishing stock removal of about 45 nm, whereby total polishing was carried out with a target polishing stock removal of about 90 nm.

Figure 2:
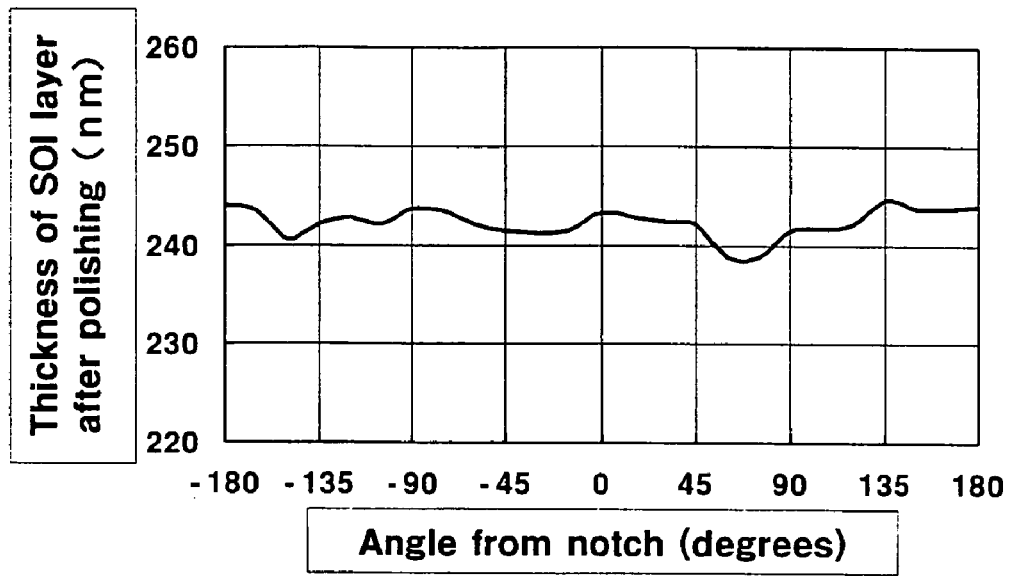
FIG. 2 is a graph showing thickness distribution of an SOI layer in the outer peripheral portion of an SOI wafer after polishing in Example 1.
Figure 3:
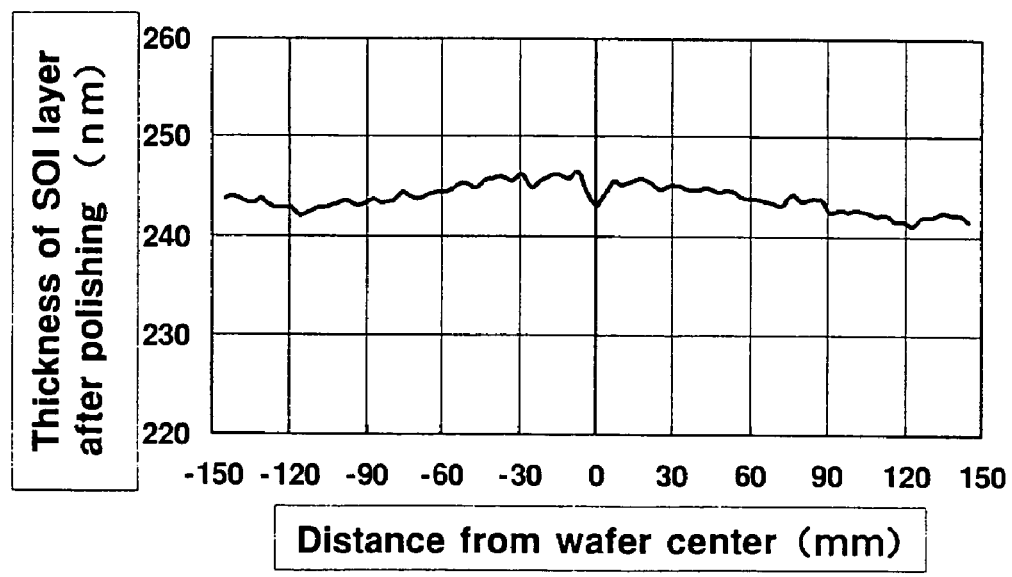
FIG. 3 is a graph showing thickness distribution of an SOI layer in a diametrical direction of an SOI wafer after polishing in Example 1.
Figure 6:
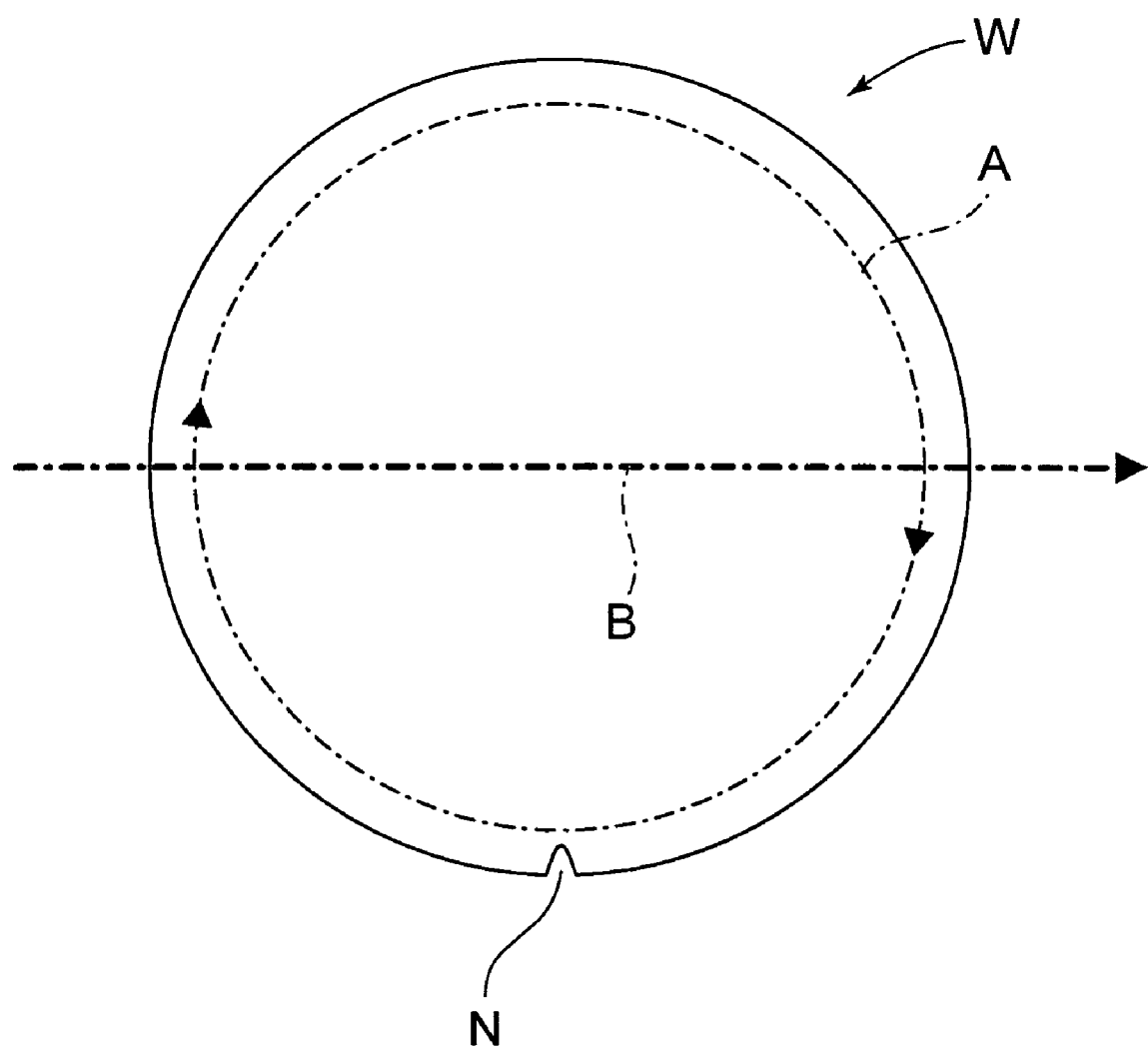
FIG. 6 is a descriptive top view showing an example of a method for configuration evaluation of a wafer.
Figure 7:
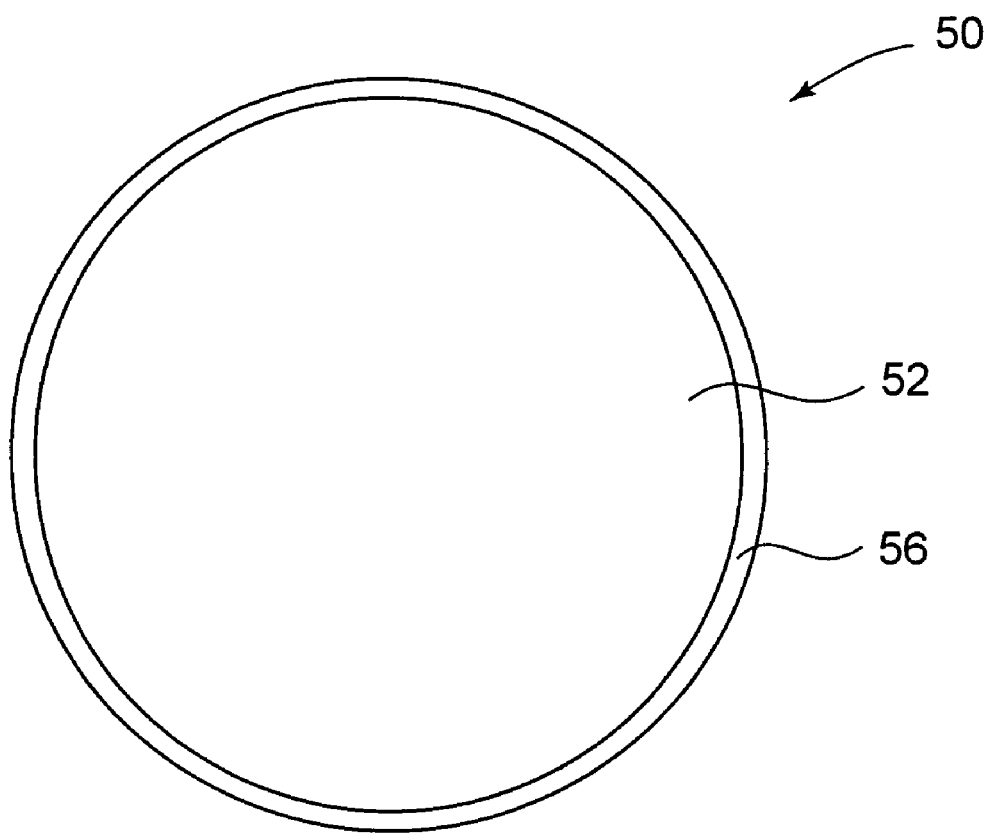
FIGS. 7(*a*) and 7(*b*) are descriptive views showing an example of structure of an SOI wafer, wherein FIG. 7(*a*) is a descriptive top view and FIG. 7(*b*) is a descriptive sectional view.
Figure 7:
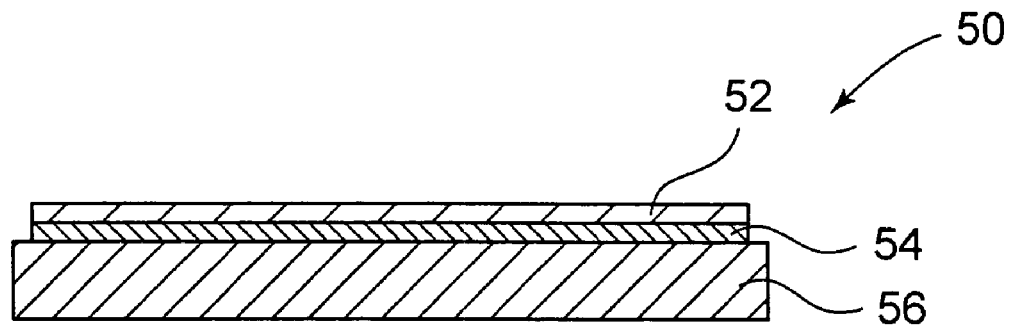
Figure 8:
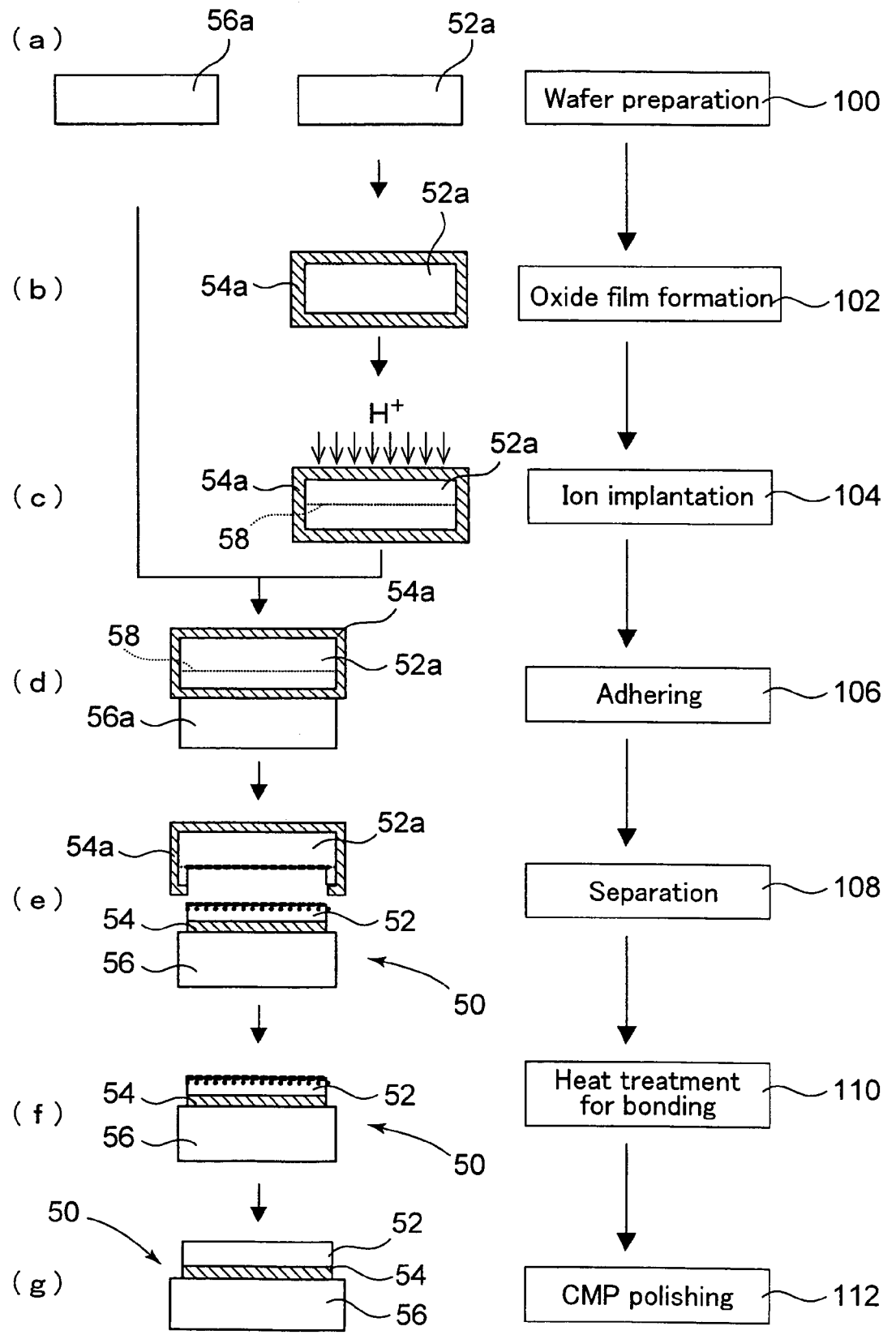
FIG. 8 is a flowchart showing a manufacturing procedure ((a)-(g)) for an SOI wafer together with schematic views.

As a result, actually polishing was carried out with the total polishing stock removal of about 94 nm. A configuration after completion of the polishing was resulted as shown in FIGS. 2 and 3. FIG. 2 shows values obtained by evaluation with ACUMAP II manufactured by ADE Corporation at a angular spacing of 4 degrees (with a position of the notch being 0 degree) on a thickness of an SOI layer along the wafer outer peripheral portion (at positions spaced from the wafer outer periphery by 5 mm) as shown in FIG. 6. In FIG. 6, reference symbol (N) designates a notch, (A) a scanning direction for evaluation of outer peripheral waviness, and (B) a scanning direction for evaluation of thickness in the diametrical direction. FIG. 3 shows values obtained by measuring thickness at a 4 mm spacing in a diametrical direction of a wafer in a similar way.

While cyclic waviness is slightly observed as can be seen from FIG. 2, a fluctuation in thickness is on the order of 6.63 nm, which was improved considerably more than that in Comparative Example 1 described below. A fluctuation in a diametrical direction also was as good as 5.23 nm.

Comparative Example 1

An SOI wafer as a polishing object in use was similar to one in Example 1 with the exception that an SOI layer was about 280 nm. Polishing was carried out on the SOI wafer in the same conditions as those in Example 1. A wafer held on the polishing head was polished in one operation to a target polishing stock removal of about 90 nm without changing a holding position thereof.

Figure 4:
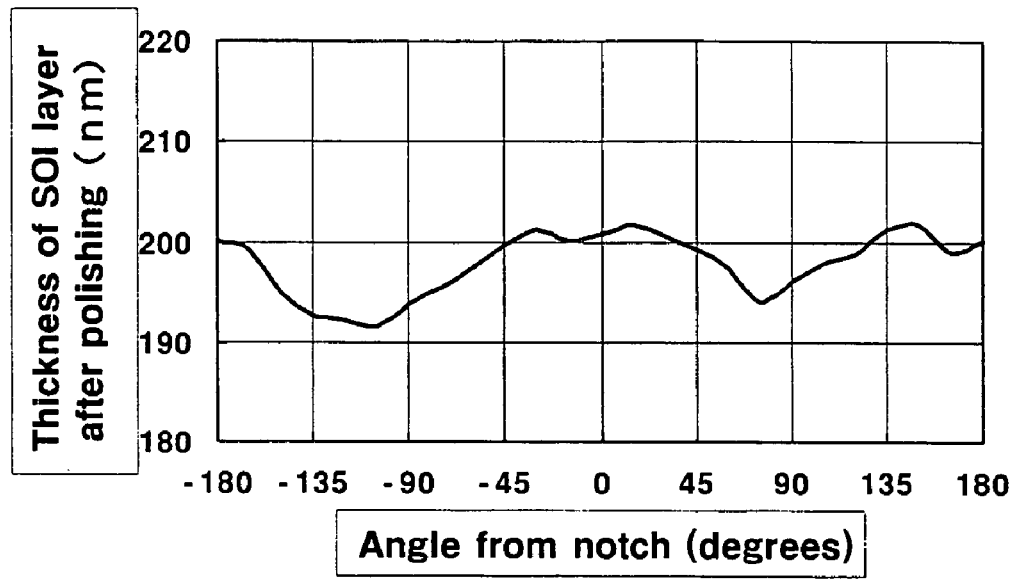
FIG. 4 is a graph showing thickness distribution of an SOI layer in the outer peripheral portion of an SOI wafer after polishing in Comparative Example 1.
Figure 5:
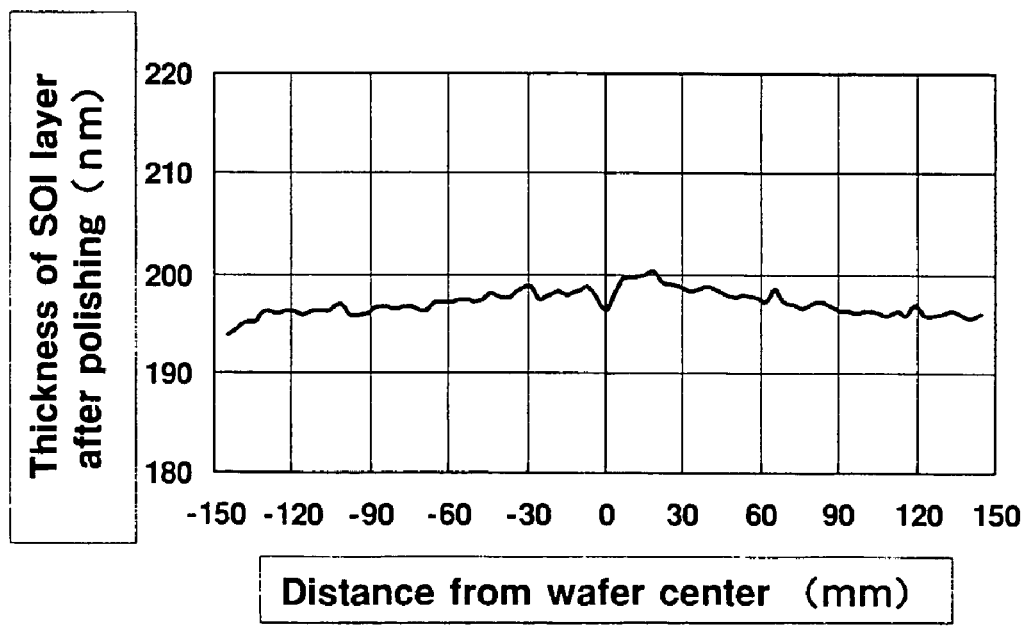
FIG. 5 is a graph showing thickness distribution of an SOI layer in a diametrical direction of an SOI wafer after polishing in Comparative Example 1.

As a result, an actual polishing stock removal was 83 nm. A configuration of the polished wafer was resulted in the profiles as shown in FIGS. 4 and 5. These results are evaluated in the same way as Example 1. FIG. 4 shows a result obtained by measuring thickness distribution along the outer peripheral portion of the wafer after completion of the polishing and FIG. 5 shows a result obtained by measuring thickness in a diametrical direction of the wafer.

As can be seen from FIG. 4, even in such a small polishing stock removal, cyclic peripheral sags of the wafer were clearly observed. A fluctuation in thickness was 10.27 nm. A fluctuation in thickness in diametrical direction was also on the order of 6.40 nm.

As described above, it was found that by employing the same polishing head and the same wafer holding plate to carry out a kind of multi-step polishing in which only a wafer holding position is changed every polishing in the sub-steps, an influence from a portion which cannot be mechanically corrected under an influence of a fluctuation of a holding surface of a wafer holding plate of a polishing head or an influence of distortion from assembly can be canceled, thereby a wafer being polished to a high flatness level.

The present invention is not limited to the embodiments described above. The above embodiments are presented by way of illustration only and any of modifications or alterations thereof are included in the scope of the appended claims of the present invention as far as those have substantially the same construction as the technical concept stated in the appended claims of the present invention and exert an action and effect similar to those of the present invention.

For example, the number of the divided sub-steps of a wafer polishing step in the present invention is not limited to two, and the number may be further increased. Moreover, the method of the present invention can be implemented even in any type of polishing apparatus.

Capability of Exploitation in Industry

As described above, according to the present invention, an excellent effect can be exerted that sags caused by polishing are prevented and there can be manufactured a wafer, especially an SOI wafer at a high flatness level.

The invention claimed is:

1. A wafer polishing method using a polishing apparatus which comprises a rotatable table having a polishing cloth adhered thereon and a polishing head equipped with a wafer holding plate opposing to the table and in which the back surface of the wafer is held by a holding surface of the wafer holding plate and the front surface of the wafer is pressed to and polished by the polishing pad, comprising a polishing step of polishing the front surface of the wafer to a predetermined total polishing stock removal without changing the polishing apparatus, wherein the polishing step is divided into plural sub-steps and a holding position of the wafer in a subsequent sub-step is different from a holding position of the wafer in a previous sub-step, wherein the change of the wafer holding position is performed by rotating a holding position of the wafer about the center thereof as the center of rotation by a predetermined rotational angle and the predetermined rotational angle is set to an angle obtained by dividing outer peripheral waviness of the wafer by the number (n) of the sub-steps.

2. A wafer polishing method using a polishing apparatus which comprises a rotatable table having a polishing cloth adhered thereon and a polishing head equipped with a wafer holding plate opposing to the table and in which the back surface of the wafer is held by a holding surface of the wafer holding plate and the front surface of the wafer is pressed to and polished by the polishing pad, comprising a polishing step of polishing the front surface of the wafer to a predetermined total polishing stock removal without changing the polishing apparatus, wherein the polishing step is divided into plural sub-steps and a holding position of the wafer in a subsequent sub-step is different from a holding position of the wafer in a previous sub-step, wherein the change of a wafer holding position is performed by rotating a holding position of the wafer about the center thereof as the center of rotation by a predetermined rotational angle and the predetermined rotational angle is set to ½ of outer peripheral waviness of the wafer.

* * * * *